(12) United States Patent
Lai et al.

(10) Patent No.: US 11,102,913 B2
(45) Date of Patent: Aug. 24, 2021

(54) HEAT DISSIPATING ASSEMBLY AND MAIN BOARD MODULE

(71) Applicant: GIGA-BYTE TECHNOLOGY CO., LTD., New Taipei (TW)

(72) Inventors: Chih-Ming Lai, New Taipei (TW); Yung-Shun Kao, New Taipei (TW); Tzu-Hsiang Huang, New Taipei (TW)

(73) Assignee: GIGA-BYTE TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 16/920,357

(22) Filed: Jul. 2, 2020

(65) Prior Publication Data

US 2021/0227716 A1 Jul. 22, 2021

(30) Foreign Application Priority Data

Jan. 20, 2020 (TW) .................................. 109101854

(51) Int. Cl.
*H05K 7/20* (2006.01)
*G06F 1/20* (2006.01)
*G06F 1/18* (2006.01)

(52) U.S. Cl.
CPC ........... *H05K 7/2039* (2013.01); *G06F 1/185* (2013.01); *G06F 1/20* (2013.01)

(58) Field of Classification Search
CPC ...... H05K 7/2039; H05K 1/141; H05K 1/144; H05K 2201/042; H05K 2201/10409; H05K 7/1417; H05K 2201/2036; H05K 1/0201; H05K 1/14; H05K 2201/10393; H05K 2201/10598; H05K 7/10; H05K 1/142; H05K 2201/10272; H05K 3/301;
(Continued)

(56) References Cited

U.S. PATENT DOCUMENTS 6,101,089 A * 8/2000 Seto ....................... H05K 1/144
361/679.47
6,643,137 B1* 11/2003 Chung .................. H01L 23/367
165/185
(Continued)

FOREIGN PATENT DOCUMENTS

CN 208271079 12/2018
TW M572626 1/2019

OTHER PUBLICATIONS

"Office Action of Taiwan Counterpart Application", dated Jul. 16, 2020, p. 1-p. 9.

*Primary Examiner* — Stephen S Sul
*Assistant Examiner* — Michael A Matey
(74) *Attorney, Agent, or Firm* — JCIPRNET (57) ABSTRACT

A heat dissipating assembly, adapted to be disposed at an M.2 expansion card and configured onto a main board with the M.2 expansion card, is provided. The heat dissipating assembly includes a first heat dissipating member and a first double-end screwing member. The first heat dissipating member is adapted to be disposed on the main board, located between the main board and the M.2 expansion card, and has at least one first through hole. The first double-end screwing member includes a first thread and a first nut having a first screw hole. The first thread passes through one of the at least one first through hole of the first heat dissipating member and is detachably fixed to the main board. The first nut presses against the first heat dissipating member.

11 Claims, 8 Drawing Sheets

(58) Field of Classification Search
CPC ....... H05K 7/20418; G06F 1/185; G06F 1/20; G06F 1/186; G06F 13/4068; G06F 1/1658; G06F 1/187; G06F 15/7803; G06F 1/183; G06F 2213/0032; H01L 23/4006; H01L 2023/4087; H01L 23/4093; H01L 23/367; H01R 12/716; F16B 19/1081; F16B 21/082
See application file for complete search history.

(56) References Cited

U.S. PATENT DOCUMENTS

| | | | | |
|---|---|---|---|---|
| 6,731,514 B2* | 5/2004 | Evans | ............... | H05K 1/144 361/785 |
| 6,738,254 B2* | 5/2004 | Oogami | ............... | G06F 1/203 361/137 |
| 7,592,749 B2* | 9/2009 | Kim | ............... | H05K 5/02 313/582 |
| 8,085,552 B2* | 12/2011 | Takao | ............... | H05K 3/368 361/807 |
| 8,625,284 B2* | 1/2014 | Rai | ............... | H05K 1/0204 361/721 |
| 10,152,097 B1* | 12/2018 | Huang | ............... | H01L 23/4006 |
| 10,264,694 B1* | 4/2019 | Lin | ............... | H05K 7/1417 |
| 2003/0063444 A1* | 4/2003 | Kalkbrenner | ............... | H05K 7/142 361/752 |
| 2006/0077642 A1* | 4/2006 | Estes | ............... | H05K 7/142 361/752 |
| 2008/0212293 A1* | 9/2008 | Li | ............... | H05K 7/142 361/748 |
| 2010/0033942 A1* | 2/2010 | Yang | ............... | H05K 7/1417 361/809 |
| 2010/0195304 A1* | 8/2010 | Takao | ............... | G06F 1/1616 361/804 |
| 2015/0169013 A1* | 6/2015 | Lai | ............... | G06F 1/20 361/679.54 |
| 2016/0268713 A1* | 9/2016 | Norton | ............... | G06F 13/4068 |
| 2018/0295710 A1* | 10/2018 | Lai | ............... | H05K 7/20472 |
| 2018/0373664 A1* | 12/2018 | Vijayrao | ............... | G06F 15/7803 |
| 2019/0174618 A1* | 6/2019 | Chen | ............... | H05K 1/141 |
| 2019/0235155 A1* | 8/2019 | Lai | ............... | G02B 6/0085 |

* cited by examiner

HEAT DISSIPATING ASSEMBLY AND MAIN BOARD MODULE

CROSS-REFERENCE TO RELATED APPLICATION

This application claims the priority benefit of Taiwan application serial no. 109101854, filed on Jan. 20, 2020. The entirety of the above-mentioned patent application is hereby incorporated by reference herein and made a part of this specification.

BACKGROUND OF THE INVENTION

1. Field of the Invention

The invention relates to a heat dissipating assembly and a mainboard module, and in particular, to a heat dissipating assembly facilitating assembling and disassembling and a main board module having the heat dissipating assembly.

2. Description of Related Art

At present, with user's increasing demands, a variety of connectors are configured on a main board to provide more functions. For example, the main board may have a next generation form factor (NGFF) slot, that is, an M.2 slot, for an expansion card with an M.2 interface (for example, a solid-state drive with an M.2 interface) to be inserted. Because the M.2 expansion card has an excessively high temperature during use, a heat sink is installed above most M.2 expansion cards, and another heat sink is further added at the bottom of the M.2 expansion cards, so as to achieve double-sided cooling. However, the heat sink located at the bottom of the M.2 expansion card needs to be screwed upward from the back of the main board. During mass production, the main board needs to be turned over to lock the heat dissipating member between the M.2 expansion card and the main board first, and is then turned back to assemble the M.2 expansion card on the front of the main board. If the heat dissipating member between the M.2 expansion card and the main board needs to be disassembled, the whole main board needs to be disassembled from a chassis and then turned over for disassembling the heat dissipating member, causing great inconvenience in assembling and disassembling.

SUMMARY OF THE INVENTION

The invention provides a heat dissipating assembly that may be disassembled from the front of a main board.

The invention provides a main board module having the foregoing heat dissipating assembly.

A heat dissipating assembly of the invention is adapted to be disposed at an M.2 expansion card and onto a main board with the M.2 expansion card. The heat dissipating assembly includes a first heat dissipating member and a first double-end screwing member. The first heat dissipating member is adapted to be disposed on the main board and located between the main board and the M.2 expansion card. The first heat dissipating member includes at least one first through hole. The first double-end screwing member includes a first thread and a first nut having a first screw hole. The first thread passes through one of the at least one first through hole of the first heat dissipating member and is detachably fixed to the main board, and the first nut presses against the first heat dissipating member.

A main board module of the invention includes a main board, an M.2 expansion card, and a heat dissipating assembly. The M.2 expansion card is inserted into the main board. The heat dissipating assembly includes a first heat dissipating member and a first double-end screwing member. The first heat dissipating member is disposed on the main board and located between the main board and the M.2 expansion card. The first heat dissipating member includes at least one first through hole. The first double-end screwing member includes a first thread and a first nut having a first screw hole. The first thread passes through one of the at least one first through hole of the first heat dissipating member and is detachably fixed to the main board, and the first nut presses against the first heat dissipating member.

In an embodiment of the invention, the main board module includes an M.2 slot and a plurality of studs arranged beside the M.2 slot along a straight line. Each of the studs includes a top surface away from the main board and a bearing surface surrounding the top surface. The first heat dissipating member is adapted to bear against the bearing surface. There is a segment gap between the top surface and the bearing surface. A thickness of the first heat dissipating member is greater than the segment gap.

In an embodiment of the invention, the heat dissipating assembly further includes a second heat dissipating member and a first screw. The second heat dissipating member is superposed over the first heat dissipating member to clamp the M.2 expansion card with the first heat dissipating member. The second heat dissipating member includes a second through hole corresponding to the first screw hole. The first screw passes through the second through hole of the second heat dissipating member and fixes the second heat dissipating member to the first heat dissipating member.

In an embodiment of the invention, the heat dissipating assembly further includes a second double-end screwing member and a second screw. The second double-end screwing member includes a second thread and a second nut including a second screw hole. The at least one first through hole includes a plurality of first through holes. The first thread passes through one of the first through holes that is farthest away from an M.2 slot of the main board, and the second thread passes through another one that is of the first through holes of the first heat dissipating member and that is located beside a tail end of the M.2 expansion card and is detachably fixed to the main board. The tail end of the M.2 expansion card is adapted to be located on the second nut. The second screw is detachably screwed to the second screw hole and presses against the M.2 expansion card to fix the M.2 expansion card to the first heat dissipating member. The first screw hole is exposed from the second through hole of the second heat dissipating member, and the first screw is detachably screwed to the first screw hole.

In an embodiment of the invention, the second double-end screwing member includes a second thread and a second nut including a second screw hole. A tail end of the M.2 expansion card is located on the first nut of the first double-end screwing member. The second thread is detachably fixed to the first screw hole. The second nut presses against the M.2 expansion card. The second screw hole is exposed from the second through hole of the second heat dissipating member, and the first screw is detachably screwed to the second screw hole.

In an embodiment of the invention, the heat dissipating assembly further includes a first heat dissipating adhesive layer disposed on an inner surface of the first heat dissipating member facing the M.2 expansion card. The at least one first through hole includes a plurality of first through holes arranged along a straight line. The first heat dissipating adhesive layer includes a plurality of adhesive layer holes corresponding to the first through holes, respectively. An inner diameter of each of the adhesive layer holes is greater than an inner diameter of the corresponding first through hole.

Based on the above, the first heat dissipating member of the heat dissipating assembly of the invention is disposed between the main board and the M.2 expansion card. The first thread of the first double-end screwing member passes through the first through hole of the first heat dissipating member and is detachably fixed to the main board. In addition, the first nut presses against the first heat dissipating member to fix the first heat dissipating member to the main board. In such a design, the first heat dissipating member disposed between the main board and the M.2 expansion card may be removed from the front of the main board, greatly facilitating assembling or disassembling.

DESCRIPTION OF THE EMBODIMENTS

Figure 1:
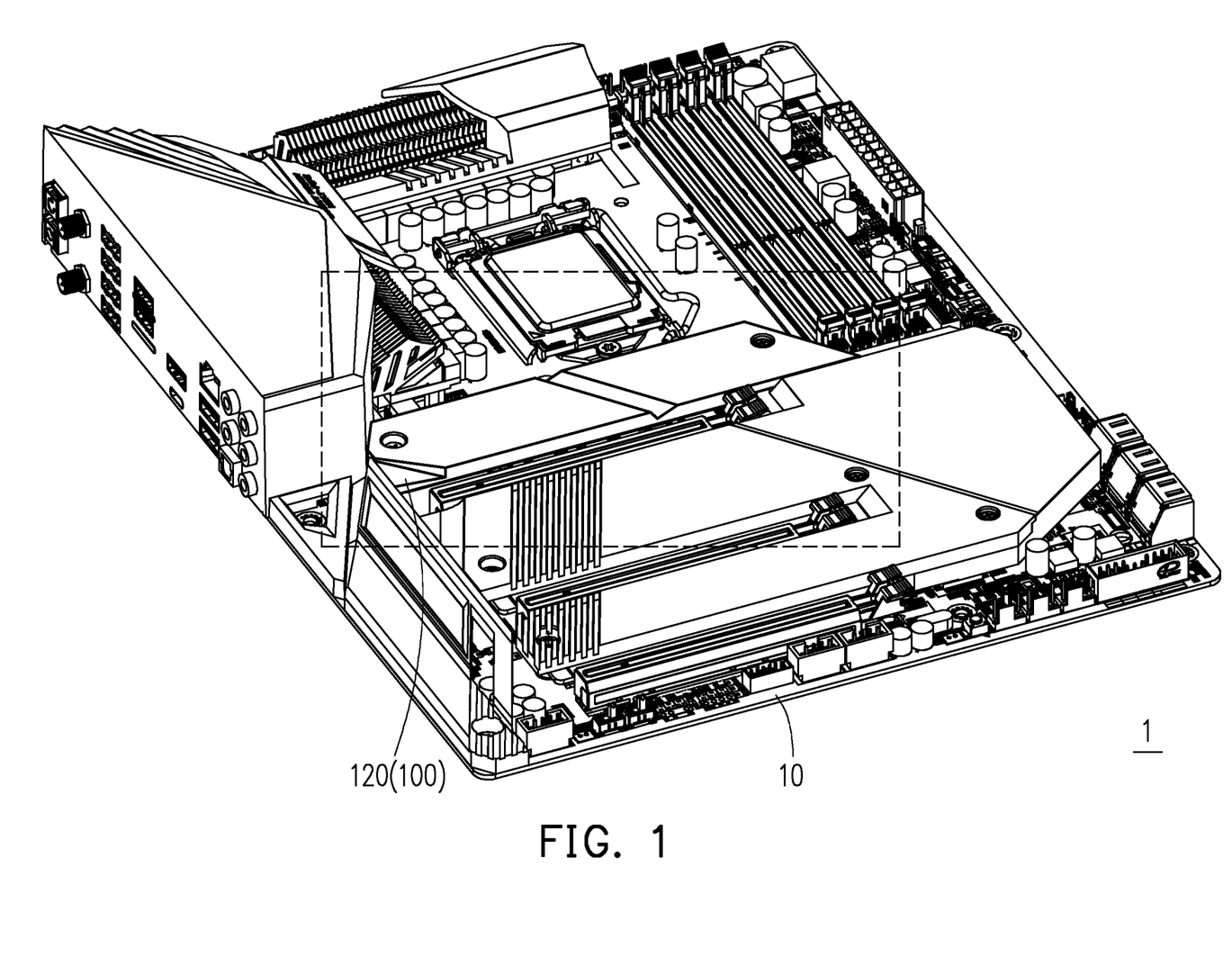
FIG. 1 is a schematic diagram of a main board module according to an embodiment of the invention.
Figure 2:
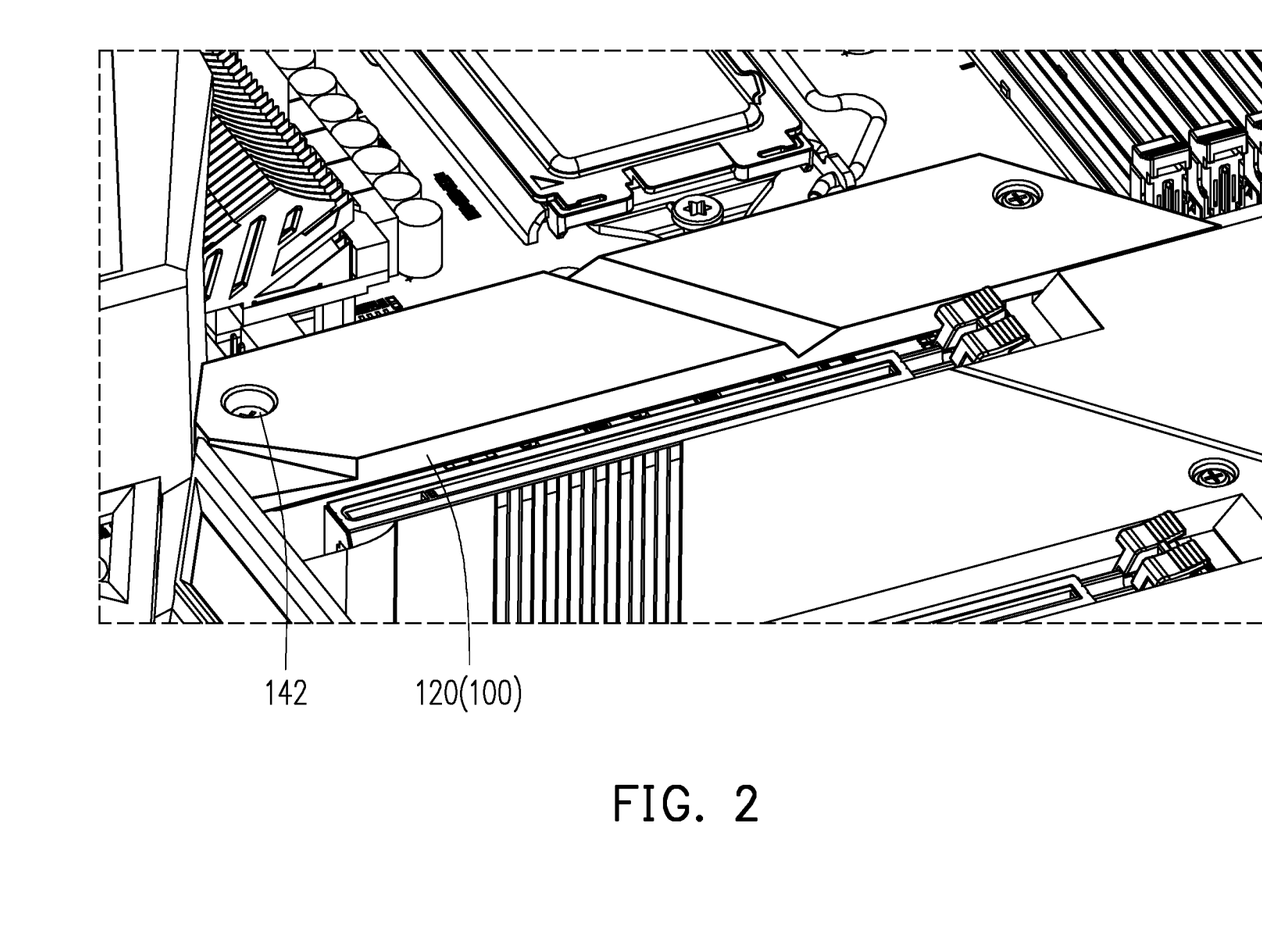
FIG. 2 is a partially enlarged view of FIG. 1.
Figure 3:
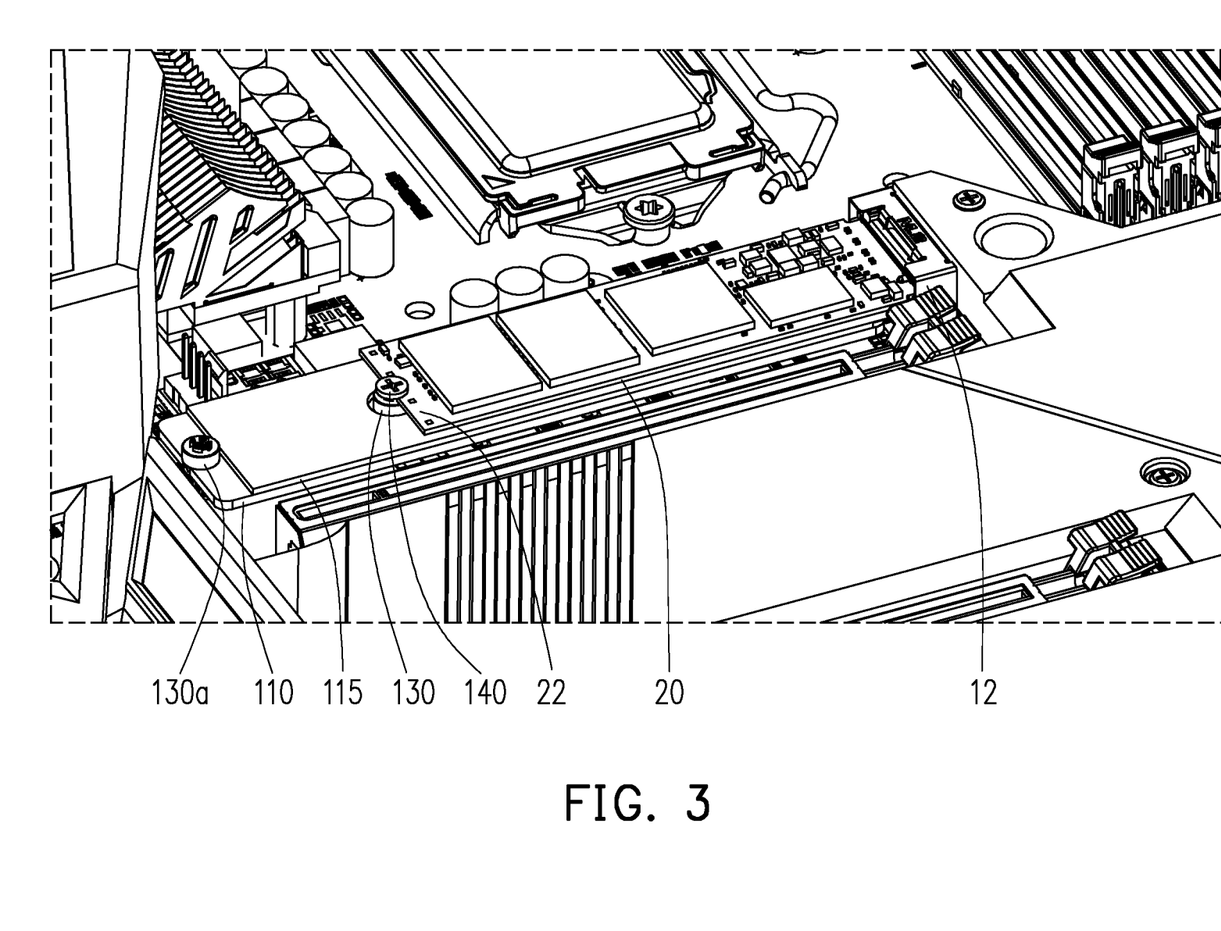
FIG. 3 is a schematic diagram that hides a second heat dissipating member of a heat dissipating assembly in FIG. 2.
Figure 4:
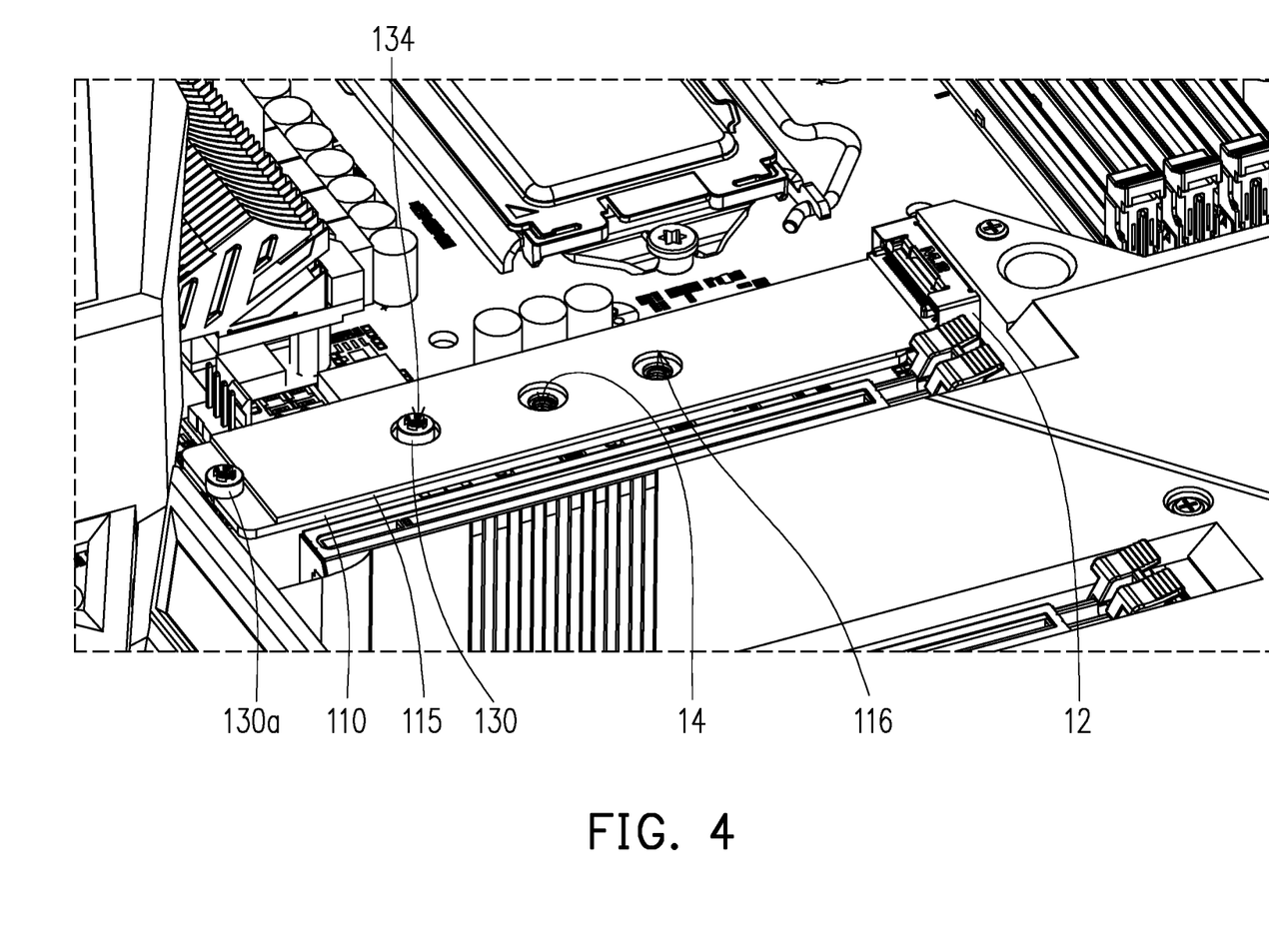
FIG. 4 is a schematic diagram that hides an M.2 expansion card in FIG. 3.
Figure 5:
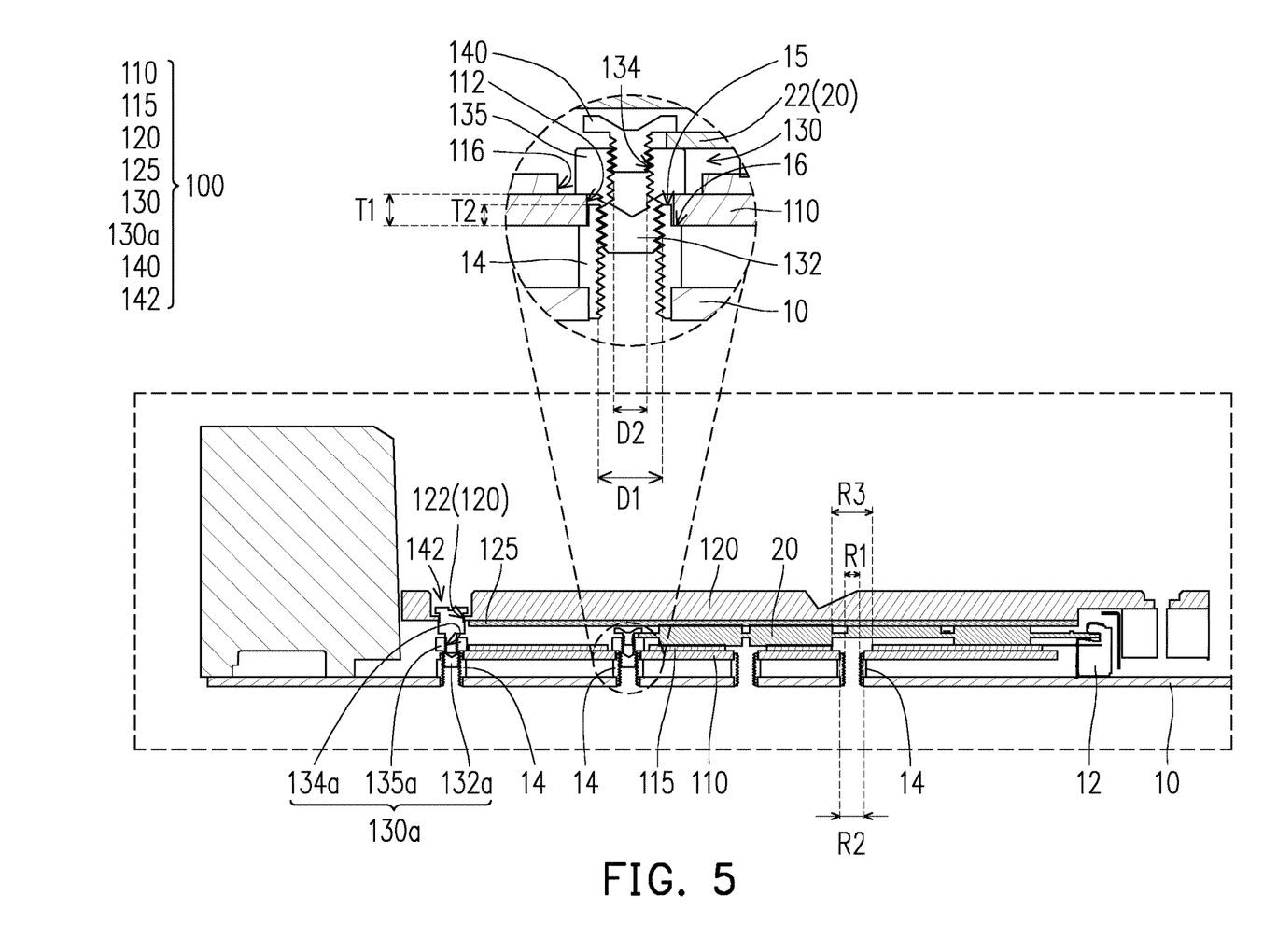
FIG. 5 is a schematic cross-sectional view of FIG. 2.

FIG. 1 is a schematic diagram of a main board module according to an embodiment of the invention. FIG. 2 is a partially enlarged view of FIG. 1. FIG. 3 is a schematic diagram that hides a second heat dissipating member of a heat dissipating assembly in FIG. 2. FIG. 4 is a schematic diagram that hides an M.2 expansion card in FIG. 3. FIG. 5 is a schematic cross-sectional view of FIG. 2.

Referring to FIG. 1 to FIG. 5, a main board module 1 in the present embodiment includes a main board 10, an M.2 expansion card 20 (FIG. 5), and a heat dissipating assembly 100. As shown in FIG. 5, the main board 10 includes an M.2 slot 12 and a plurality of studs 14 arranged beside the M.2 slot 12 along a straight line. The M.2 expansion card 20 is inserted into the M.2 slot 12 of the main board 10.

Since the M.2 expansion card 20 has a variety of different sizes, a plurality of corresponding fixing structures (studs 14) are usually disposed at a plurality of positions correspondingly on the main board 10 away from the M.2 slot 12 to fix the M.2 expansion card 20. For example, the M.2 expansion card may have a length of 30 millimeters, 42 millimeters, 60 millimeters, 80 millimeters, etc. The corresponding studs 14 are disposed at positions on the main board 10 away from the M.2 slot 12 by 30 millimeters, 42 millimeters, 60 millimeters, and 80 millimeters, so that the M.2 expansion cards of different lengths can be fixed to the main board 10.

As shown in FIG. 4 and FIG. 5, in the present embodiment, the heat dissipating assembly 100 includes a first heat dissipating member 110 and a first double-end screwing member 130a. The first heat dissipating member 110 is disposed on the main board 10 and located between the main board 10 and the M.2 expansion card 20. It may be learned from the enlarged part in FIG. 5 that, the stud 14 includes a top surface 15 away from the main board 10 and a bearing surface 16 surrounding the top surface 15. The first heat dissipating member 110 is adapted to bear against the bearing surface 16.

In the present embodiment, a segment gap T2 exists between the top surface 15 and the bearing surface 16 to facilitate positioning of the first heat dissipating member 110. In addition, a thickness T1 of the first heat dissipating member 110 is greater than the segment gap T2, so that the first heat dissipating member 110 protrudes from the top surface 15 of the stud 14, thereby being pressed and fixed by an upper element subsequently.

The first heat dissipating member 110 includes at least one first through hole 112. In the present embodiment, the at least one first through hole 112 includes a plurality of first through holes 112. A number (for example, four) and positions of the first through holes 112 correspond to a number and positions of the studs 14 on the main board 10. However, a relationship between the first through hole 112 and the stud 14 is not limited thereto. In other embodiments, the first through hole 112 may also not correspond to the stud 14, and there may be only one first through hole. In addition, since the first heat dissipating member 110 is placed on the bearing surface 16 of the stud 14 that is at a more outer position on the stud 14, an inner diameter R2 of the first through hole 112 is slightly greater than an inner diameter R1 of the stud 14.

The first double-end screwing member 130a includes a first thread 132a and a first nut 135a. The first nut 135a includes a first screw hole 134a. The first thread 132a passes through one of the first through holes 112 of the first heat dissipating member 110 and is detachably fixed to the main board 10, and the first nut 135a presses against the first heat dissipating member 110. In the present embodiment, the first thread 132a of the first double-end screwing member 130a is, for example, screwed to one of the studs 14 farthest from the M.2 slot 12. However, a position at which the first double-end screwing member 130a is disposed is not limited thereto.

In addition, in the present embodiment, the heat dissipating assembly 100 further includes a second heat dissipating member 120 and a first screw 142. The second heat dissipating member 120 is superposed over the first heat dissipating member 110 to clamp the M.2 expansion card 20 with the first heat dissipating member 110. Corresponding to FIG. 2 to FIG. 5, the main board 10 is located at the bottom layer, followed by the first heat dissipating member 110, the M.2 expansion card 20, and the second heat dissipating member 120 successively.

In addition, the second heat dissipating member 120 includes a second through hole 122 corresponding to the first screw hole 134a. A position of the second through hole 122 substantially corresponds to the stud 14 on the main board 10 farthest from the M.2 slot 12 (for example, the stud 14 away from the M.2 slot 12 by 80 millimeters), but the invention is not limited thereto In the present embodiment, the first screw hole 134a is exposed from the second through hole 122 of the second heat dissipating member 120. The first screw 142 passes through the second through hole 122 of the second heat dissipating member 120 and is detachably screwed to the first screw hole 134a to fix the second heat dissipating member 120 to the first heat dissipating member 110.

In the present embodiment, the length of the M.2 expansion card 20 is, for example, 60 millimeters. Therefore, the M.2 expansion card 20 does not need to be fixed using the stud 14 farthest from the M.2 slot 12. Therefore, the stud 14 farthest from the M.2 slot 12 may be exclusively configured to fix the second heat dissipating member 120 to the first heat dissipating member 110. Certainly, the invention is not limited thereto in other embodiments.

In addition, the heat dissipating assembly 100 further includes a first heat dissipating adhesive layer 115 and a second heat dissipating adhesive layer 125. The first heat dissipating adhesive layer 115 is disposed on an inner surface (an upper surface) of the first heat dissipating member 110 facing the M.2 expansion card 20. The second heat dissipating adhesive layer 125 is disposed on an inner surface (a lower surface) of the second heat dissipating member 120 facing the M.2 expansion card 20. In the present embodiment, the first heat dissipating adhesive layer 115 includes a plurality of adhesive layer holes 116 corresponding to a number (for example, three) and positions of the first through holes 112, respectively. An inner diameter R3 of each adhesive layer hole 116 is greater than the inner diameter R2 of the corresponding first through hole 112 to form a ladder-like structure. Such a structure can help the first double-end screwing member 130a pass through the first heat dissipating adhesive layer 115 and the first heat dissipating member 110 from the top to the bottom.

It is worth mentioning that, in order to fix the M.2 expansion card 20, the heat dissipating assembly 100 further includes a second double-end screwing member 130 and a second screw 140. The second double-end screwing member 130 includes a second thread 132 and a second nut 135. The second nut 135 includes a second screw hole 134. In the present embodiment, the first double-end screwing member 130a and the second double-end screwing member 130 have, for example, a same structure, but the invention is not limited thereto.

The second thread 132 passes through the first through hole 112 of the first heat dissipating member 110 located beside a tail end 22 of the M.2 expansion card 20 and is detachably fixed to the stud 14 of the main board 10 (the stud 14 away from the M.2 slot 12 by 60 millimeters).

As shown in an enlarged part of FIG. 5, in the present embodiment, the tail end 22 of the M.2 expansion card 20 is located on the second nut 135. The second screw 140 is detachably screwed to the second screw hole 134 and presses against the M.2 expansion card 20 to fix the M.2 expansion card 20 to the first heat dissipating member 110. In the present embodiment, an outer diameter D1 of the second thread 132 of the second double-end screwing member 130 is greater than an outer diameter D2 of the second screw 140 (or an inner diameter of the second screw hole 134), so that the second thread 132 has a sufficient width to be provided with the second screw hole 134 therein, so that the second screw 140 can be screwed to the second double-end screwing member 130.

Compared to a conventional structure in which the heat dissipating member is assembled at the back of the main board, during mass production, the main board needs to be turned over to lock the heat dissipating member between the M.2 expansion card and the main board first, and is then turned back to assemble the M.2 expansion card on the front of the main board. If the heat dissipating member between the M.2 expansion card and the main board needs to be disassembled, the whole main board needs to be disassembled from a chassis and then turned over for disassembling the heat dissipating member, causing great inconvenience in assembling and disassembling. The first heat dissipating member 110 of the heat dissipating assembly 100 in the present embodiment may be assembled at the front of the main board 10 without turning over during mass production, reducing a probability of falling off of screws during turning over, and increasing production fluency. The first heat dissipating member 110 and the first double-end screwing member 130a may also be directly disassembled from the front, which is quite convenient in use.

In addition, in the present embodiment, the heat dissipating assembly 100 is fixed using the stud 14 originally configured to fix the M.2 expansion card 20 on the main board 10 without a need to dispose an additional fixing structure on the main board 10, so that an original line layout of the main board 10 is not affected.

Figure 6:
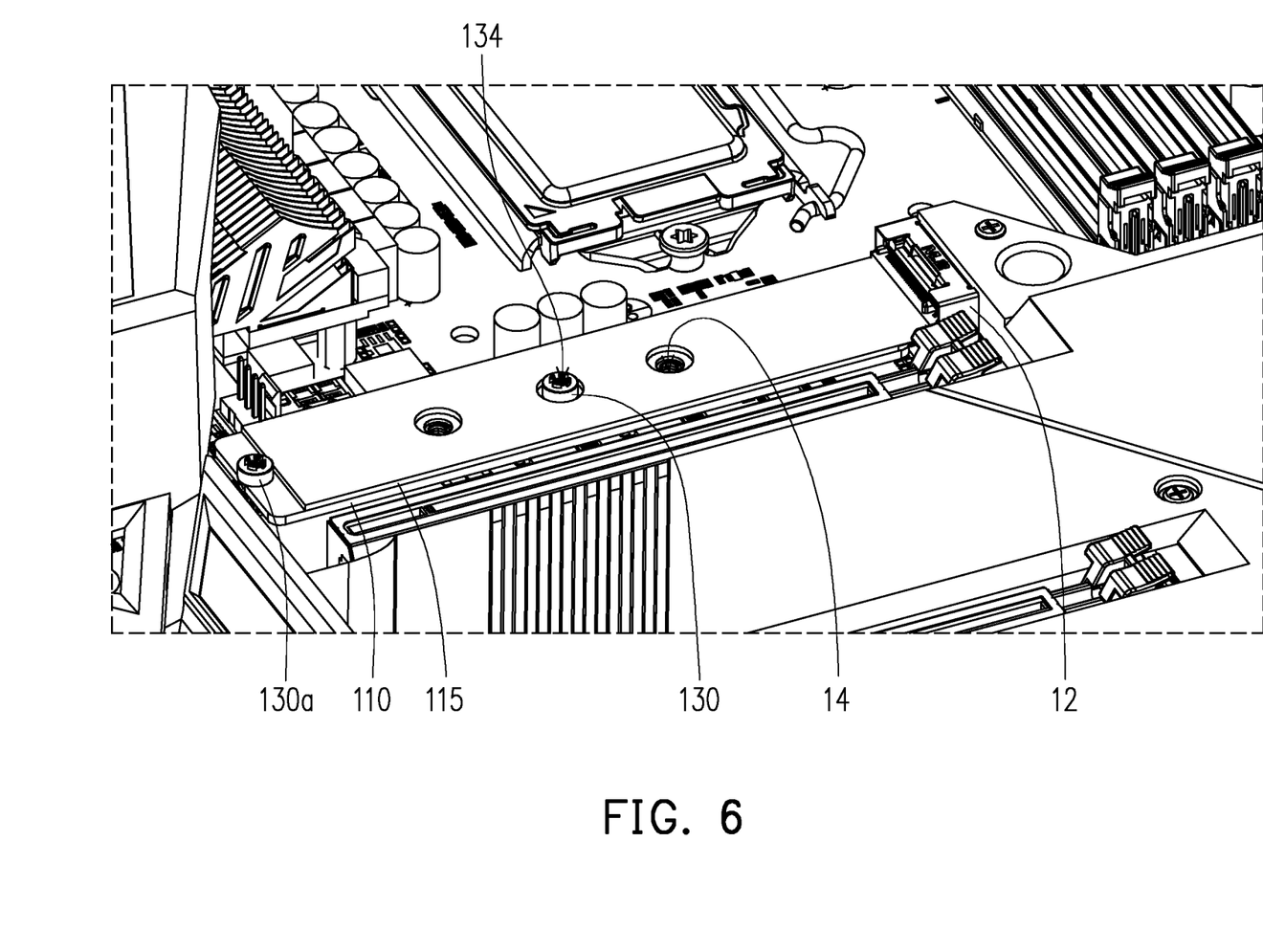
FIG. 6 and FIG. 7 are schematic diagrams of disposing a second double-end screwing member at other positions.
Figure 7:
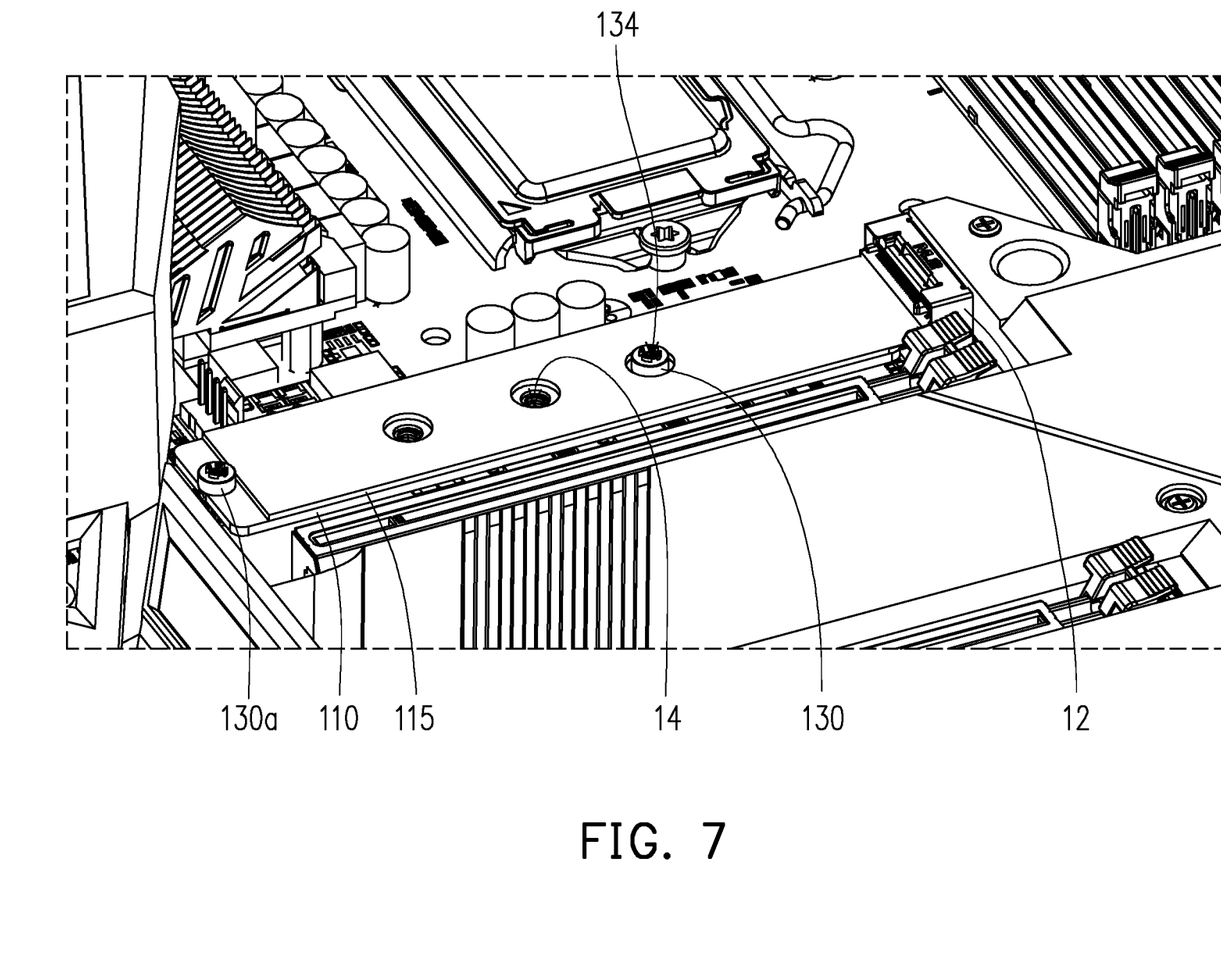

Certainly, the length of the M.2 expansion card 20 applied to the heat dissipating assembly 100 in the present embodiment is not limited to 60 millimeters. FIG. 6 and FIG. 7 are schematic diagrams of disposing a second double-end screwing member at other positions. Referring to FIG. 6, the second double-end screwing member 130 may also be disposed on the stud 14 away from the M.2 slot 12 by about 42 millimeters to fix the M.2 expansion card 20 (not shown) with a fixed length of about 42 millimeters. Alternatively, referring to FIG. 7, the second double-end screwing member 130 may also be disposed on the stud 14 away from the M.2 slot 12 by about 30 millimeters to fix the M.2 expansion card 20 (not shown) with a fixed length of about 30 millimeters.

Figure 8:
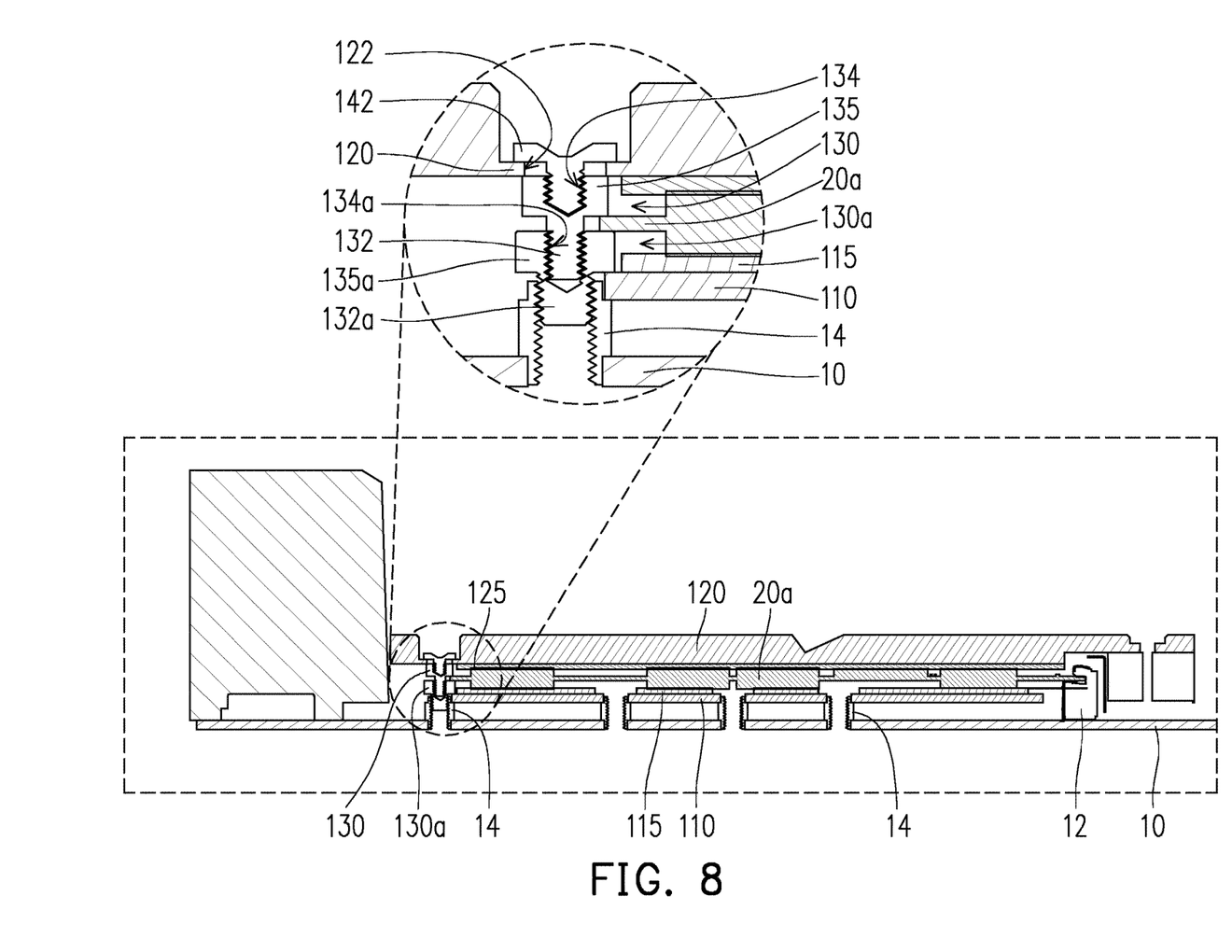
FIG. 8 is a schematic cross-sectional view of a heat dissipating assembly and an M.2 expansion card of another length according to an embodiment of the invention.

FIG. 8 is a schematic cross-sectional view of a heat dissipating assembly and an M.2 expansion card of another length according to an embodiment of the invention. Referring to FIG. 8, in the present embodiment, the length of the M.2 expansion card 20 applied to the heat dissipating assembly 100 is, for example, 80 millimeters. The M.2 expansion card 20 and the second heat dissipating member 120 may be fixed to the main board 10 using a same stud 14 (that is, the stud 14 farthest from the M.2 slot 12).

In particular, as shown in an enlarged part of FIG. 8 from the bottom to the top, in the present embodiment, the first thread 132a of the first double-end screwing member 130a passes through the first through hole 112 of the first heat dissipating member 110 and is detachably fixed to the stud 14 on the main board 10, and the first nut 135a presses against first heat dissipating member 110, so that the first heat dissipating member 110 is clamped between the bearing surface 16 of the stud 14 and the first nut 135a of the first double-end screwing member 130a.

Next, the tail end 22 of the M.2 expansion card 20 is located on the first nut 135a of the first double-end screwing member 130a, and the second thread 132 of the second double-end screwing member 130 is detachably fixed to the first screw hole 134a. In addition, the second nut 135 presses against the M.2 expansion card 20, so that the M.2 expansion card 20 is clamped between the first nut 135a of the first double-end screwing member 130a and the second nut 135 of the second double-end screwing member 130. In the present embodiment, a size of the first double-end screwing member 130a is, for example, greater than a size of the second double-end screwing member 130, so that the second double-end screwing member 130 can be screwed to the first double-end screwing member 130a.

In addition, the second heat dissipating member 120 is located on the second nut 135 of the second double-end screwing member 130, and the second screw hole 134 is exposed from the second through hole 122 of the second heat dissipating member 120. In addition, the first screw 142 is detachably screwed to the second screw hole 134, so that the second heat dissipating member 120 is clamped between the second nut 135 and the first screw 142 of the second double-end screwing member 130.

Therefore, the heat dissipating assembly 100 in the present embodiment may be applied to the M.2 expansion cards of different sizes, and may be assembled and disassembled from the front of the main board 10, which is quite convenient in use. In addition, the heat dissipating assembly 100 in the present embodiment may share the original stud 14 on the main board 10 without affecting a design of the main board 10 and may be directly applied to the existing main board 10.

Based on the above, the first heat dissipating member of the heat dissipating assembly of the invention is disposed between the main board and the M.2 expansion card. The first thread of the first double-end screwing member passes through the first through hole of the first heat dissipating member and is detachably fixed to the main board. In addition, the first nut presses against the first heat dissipating member to fix the first heat dissipating member to the main board. In such a design, the first heat dissipating member disposed between the main board and the M.2 expansion card may be removed from the front of the main board, greatly facilitating assembling or disassembling.

What is claimed is:

1. A heat dissipating assembly, adapted to be disposed at an M.2 expansion card and configured onto a main board with the M.2 expansion card, comprising:
    a first heat dissipating member, adapted to be disposed on the main board, located between the main board and the M.2 expansion card, and comprising at least one first through hole; and
    a first double-end screwing member, comprising a first thread and a first nut comprising a first screw hole, wherein the first thread passes through one of the at least one first through hole of the first heat dissipating member and is detachably fixed to the main board, and the first nut presses against the first heat dissipating member.

2. The heat dissipating assembly according to claim 1, further comprising:
    a second heat dissipating member, superposed over the first heat dissipating member to be adapted to clamp the M.2 expansion card with the first heat dissipating member, wherein the second heat dissipating member comprises a second through hole corresponding to the first screw hole; and
    a first screw, passing through the second through hole of the second heat dissipating member and fixing the second heat dissipating member to the first heat dissipating member.

3. The heat dissipating assembly according to claim 2, further comprising:
    a second double-end screwing member, comprising a second thread and a second nut comprising a second screw hole, wherein the at least one first through hole comprises a plurality of first through holes, the first thread passes through one of the first through holes farthest away from an M.2 slot of the main board, the second thread passes through another one the first through holes of the first heat dissipating member located beside a tail end of the M.2 expansion card and detachably fixed to the main board, and the tail end of the M.2 expansion card is adapted to be located on the second nut; and
    a second screw, detachably screwed to the second screw hole and pressing against the M.2 expansion card to fix the M.2 expansion card to the first heat dissipating member, wherein
    the first screw hole is exposed from the second through hole of the second heat dissipating member and the first screw is detachably screwed to the first screw hole.

4. The heat dissipating assembly according to claim 2, further comprising:
    a second double-end screwing member, comprising a second thread and a second nut comprising a second screw hole, wherein a tail end of the M.2 expansion card is located on the first nut of the first double-end screwing member, the second thread is detachably fixed to the first screw hole, the second nut presses against the M.2 expansion card, the second screw hole is exposed from the second through hole of the second heat dissipating member, and the first screw is detachably screwed to the second screw hole.

5. The heat dissipating assembly according to claim 1, further comprising:
    a first heat dissipating adhesive layer, disposed on an inner surface of the first heat dissipating member facing the M.2 expansion card, wherein the at least one first through hole comprises a plurality of first through holes arranged along a straight line, the first heat dissipating adhesive layer comprises a plurality of adhesive layer holes corresponding to the first through holes, respectively, and an inner diameter of each of the adhesive layer holes is greater than an inner diameter of the corresponding first through hole.

6. A main board module, comprising:
    a main board;
    an M.2 expansion card, inserted into the main board; and
    a heat dissipating assembly, comprising:
        a first heat dissipating member, disposed on the main board, located between the main board and the M.2 expansion card, and comprising at least one first through hole; and
        a first double-end screwing member, comprising a first thread and a first nut comprising a first screw hole, wherein the first thread passes through one of the at least one first through hole of the first heat dissipating member and is detachably fixed to the main board, and the first nut presses against the first heat dissipating member.

7. The main board module according to claim 6, wherein the main board module comprises an M.2 slot and a plurality of studs located beside the M.2 slot and arranged along a straight line, each of the studs comprises a top surface away from the main board and a bearing surface surrounding the top surface, the first heat dissipating member is adapted to bear against the bearing surface, a segment gap exists between the top surface and the bearing surface, and a thickness of the first heat dissipating member is greater than the segment gap.

8. The main board module according to claim 6, wherein the heat dissipating assembly further comprises:
    a second heat dissipating member, superposed over the first heat dissipating member to clamp the M.2 expansion card with the first heat dissipating member, wherein the second heat dissipating member comprises a second through hole corresponding to the first screw hole; and a first screw, passing through the second through hole of the second heat dissipating member and fixing the second heat dissipating member to the first heat dissipating member.

9. The main board module according to claim 8, wherein the heat dissipating assembly further comprises:
a second double-end screwing member, comprising a second thread and a second nut comprising a second screw hole, wherein the at least one first through hole comprises a plurality of first through holes, the first thread passes through one of the first through holes farthest away from an M.2 slot of the main board, the second thread passes through another one of the first through holes of the first heat dissipating member located beside a tail end of the M.2 expansion card and detachably fixed to the main board, and the tail end of the M.2 expansion card is adapted to be located on the second nut; and
a second screw, detachably screwed to the second screw hole and pressing against the M.2 expansion card to fix the M.2 expansion card to the first heat dissipating member, wherein
the first screw hole is exposed from the second through hole of the second heat dissipating member and the first screw is detachably screwed to the first screw hole.

10. The main board module according to claim 8, wherein the heat dissipating assembly further comprises:
a second double-end screwing member, comprising a second thread and a second nut comprising a second screw hole, wherein a tail end of the M.2 expansion card is located on the first nut of the first double-end screwing member, the second thread is detachably fixed to the first screw hole, the second nut presses against the M.2 expansion card, the second screw hole is exposed from the second through hole of the second heat dissipating member, and the first screw is detachably screwed to the second screw hole.

11. The main board module according to claim 6, wherein the heat dissipating assembly further comprises:
a first heat dissipating adhesive layer, disposed on an inner surface of the first heat dissipating member facing the M.2 expansion card, wherein the at least one first through hole comprises a plurality of first through holes arranged along a straight line, the first heat dissipating adhesive layer comprises a plurality of adhesive layer holes corresponding to the first through holes, respectively, and an inner diameter of each of the adhesive layer holes is greater than an inner diameter of the corresponding first through hole.

* * * * *